(12) United States Patent
Murayama et al.

(10) Patent No.: US 7,033,196 B2
(45) Date of Patent: Apr. 25, 2006

(54) CONNECTOR, ELECTRONIC COMPONENT FIXING DEVICE, AND TESTER

(75) Inventors: Shigeru Murayama, Tokyo (JP); Masanori Kaneko, Tokyo (JP); Fumio Kurotori, Tokyo (JP); Shigeru Matsumura, Tokyo (JP)

(73) Assignee: Advantest Corp., Tokyo (JP)

( * ) Notice: Subject to any disclaimer, the term of this patent is extended or adjusted under 35 U.S.C. 154(b) by 59 days.

(21) Appl. No.: 11/009,261

(22) Filed: Dec. 9, 2004

(65) Prior Publication Data
US 2005/0159034 A1 Jul. 21, 2005

Related U.S. Application Data

(63) Continuation of application No. PCT/JP03/07468, filed on Jun. 12, 2003.

(30) Foreign Application Priority Data
Jun. 12, 2002 (JP) .............................. 2002-172005

(51) Int. Cl.
H01R 13/62 (2006.01)
(52) U.S. Cl. ...................................... 439/310; 439/157
(58) Field of Classification Search ................ 439/310, 439/157
See application file for complete search history.

(56) References Cited

U.S. PATENT DOCUMENTS

| | | | | |
|---|---|---|---|---|
| 4,392,700 A | * | 7/1983 | Showman et al. | 439/260 |
| 4,586,771 A | * | 5/1986 | Kraemer et al. | 439/325 |
| 4,931,022 A | * | 6/1990 | Neidich | 439/310 |
| 4,984,993 A | * | 1/1991 | Neumann et al. | 439/157 |
| 5,183,408 A | * | 2/1993 | Hatagishi | 439/147 |
| 5,660,556 A | * | 8/1997 | Badaroux et al. | 439/310 |
| 5,964,602 A | * | 10/1999 | Aoki et al. | 439/157 |
| 6,036,509 A | * | 3/2000 | Maejima | 439/157 |
| 6,045,384 A | * | 4/2000 | Norizuki et al. | 439/310 |
| 6,093,040 A | * | 7/2000 | Kodama et al. | 439/157 |
| 6,193,530 B1 | * | 2/2001 | Sakurai et al. | 439/157 |

FOREIGN PATENT DOCUMENTS

| | | |
|---|---|---|
| JP | 3-100378 | 10/1991 |
| JP | 11-102756 | 4/1999 |
| JP | 2001-13210 | 1/2001 |
| JP | 2002-246107 | 8/2002 |

* cited by examiner

Primary Examiner—Gary Paumen
(74) Attorney, Agent, or Firm—Muramatsu & Associates

(57) ABSTRACT

A connector including a plug and a socket and a driving section for fitting the plug and the socket by moving the driving section in a first direction substantially perpendicular to the fitting direction of the socket and the plug. The driving section has a first groove part provided in the first direction, and a second groove part provided substantially perpendicular to the first direction. The plug has a first protruding portion engaging with the first groove part, and the socket has a second protruding portion engaging with the first groove part. When the driving section moves in the first direction, the driving section depresses the second protruding portion in the fitting direction at the second groove part to move the socket in the fitting direction, thus fitting the plug in the socket.

16 Claims, 10 Drawing Sheets

CONNECTOR, ELECTRONIC COMPONENT FIXING DEVICE, AND TESTER

The present application is a continuation application of PCT/JP03/07468 filed on Jun. 12, 2003, claiming priority from a Japanese patent application No. 2002-172005 filed on Jun. 12, 2002, the contents of which are incorporated herein by reference.

BACKGROUND OF THE INVENTION

1. Field of the Invention

The present invention relates to a connector, a socket board, and a tester. More particularly, the present invention relates to a connector on which electronic components are mounted.

2. Description of Related Art

Conventionally, as for a tester for testing electronic components, a connector on which the electronic components are mounted to perform input and output of signals has been used. The connector includes a plug provided in a test head side, and a socket on which the electronic components are mounted. The plug and socket include plug pins and socket pins. By fitting the plug to the socket, the connector electrically connects the plug pins and the socket pins and electrically connects the electronic components with a test head.

Conventionally, a ZIF (Zero Insertion Force) connector has been used for the connector. However, as for the conventional connector, the positioning accuracy of the plug and socket was not so good, and it was difficult to fit the plug to the socket accurately. Moreover, it was difficult to fit a plurality of connectors simultaneously and accurately.

SUMMARY OF THE INVENTION

Therefore, it is an object of the present invention to provide a connector, a socket board, and a tester which can solve the foregoing problem. The above and other objects can be achieved by combinations described in the independent claims. The dependent claims define further advantageous and exemplary combinations of the present invention.

According to a first aspect of the present invention, there is provided a connector including a plug and a socket to which the plug is fit. The connector includes: a driving section operable to fit the plug to the socket by moving to a direction substantially perpendicular to a fitting direction in which the plug fits to the socket.

It is preferable that the driving section includes a first groove part provided in the first direction, and the plug includes a first protruding portion engaging with the first groove part. Moreover, it is preferable that the driving section includes a second groove part being inclined to the first direction, and the socket includes a second protruding portion engaging with the second groove part.

The driving section may press down the second protruding portion to the fitting direction in the second groove part when the driving section moves to the first direction. The socket may move to the fitting direction and fit to the plug by the second protruding portion being pressed by movement of the driving section to the first direction.

The driving section may further include a fourth groove part extending from an end of the second groove part to the fitting direction. The driving section may press down the first protruding portion to a direction opposite to the fitting direction in the first groove part when the driving section moves to the first direction.

The plug may move to a direction opposite to the fitting direction and fit to the socket by the first protruding portion being pressed down. The driving section may further include a third groove part extending from an end of the first groove part to the fitting direction.

The plug may include: a plurality of plug pins electrically connecting with an electronic component, and a plug holder having the plurality of plug pins, wherein the first protruding portion is provided in the plug holder. The socket may include: a plurality of socket pins electrically connecting with an electronic component, and a socket holder having the plurality of socket pins, wherein the second protruding portion is provided in the socket holder.

The driving section may include a plurality of the first groove parts at substantially the same location with each other in the fitting direction, and the plug may include a plurality of the first protruding portions, each of which engaging with either of the plurality of first groove parts in the fitting direction. The driving section may include a plurality of the second groove parts at substantially the same location with each other in the fitting direction, and the socket may include a plurality of the second protruding portions, each of which engaging with either of the plurality of second groove parts in the fitting direction.

The plug may include a recess on a surface which is to fit to the socket, and the socket may include a guide protruding portion engaging with the recess on a surface which is to fit to the plug. The plug may include a plurality of the recesses, and the socket may include a plurality of the guide protruding portions, each of which engaging with either of the plurality of recesses.

According to a second aspect of the present invention, there is provided an electronic component fixing device operable to fix an electronic component. The electronic component fixing device includes: a first substrate; a plurality of IC holders provided in the first substrate mounting thereon the electronic component; a plurality of plugs provided in the first substrate electrically connecting with the electronic component; second substrate; a plurality of sockets provided in the second substrate, wherein each of the plurality of sockets fits to either of the plurality of plugs; and a driving section operable to fit the plurality of plugs to the plurality of sockets by the sockets moving to a first direction substantially perpendicular to a fitting direction in which the plugs fit to the sockets.

According to a third aspect of the present invention, there is provided a tester operable to test an electronic component. The tester includes: a pattern generating section operable to generate a test signal for testing the electronic component; a waveform shaping section operable to shape the test signal; an electronic component fixing section operable to supply the test signal to the electronic component and to receive an output signal output from the electronic component based on the test signal; and a decision section operable to decide acceptability of the electronic component based on the output signal, wherein the electronic component fixing section includes: a first substrate; a plurality of IC holders provided in the first substrate mounting thereon the electronic component; a plurality of plugs provided in the first substrate electrically connecting with the electronic component; second substrate; a plurality of sockets provided in the second substrate, wherein each of the plurality of sockets fits to either of the plurality of plugs; and a driving section operable to fit the plurality of plugs to the plurality of sockets by the sockets moving to a first direction substantially perpendicular to a fitting direction in which the plugs fit to the sockets.

The summary of the invention does not necessarily describe all necessary features of the present invention. The present invention may also be a sub-combination of the features described above.

BRIEF DESCRIPTION OF THE DRAWINGS

FIGS. 7A–7C are explanatory drawings exemplary showing a configuration and movement of a driving section 80, in which FIG. 7A is a explanatory view showing a relation between the driving section 80 and the socket 76, FIG. 7B is a side view exemplary showing the driving section 80, and FIG. 7C is a side view showing another example of the driving section 80.

FIGS. 11A–D are explanatory drawings showing a movement of the plug 64 and the socket 76 during fitting operation, in which FIG. 11A is an explanatory drawing showing the plug 64, the socket 76, and the driving section 80 before fitting, which are explained in FIG. 10, FIG. 11B is an explanatory drawing showing a case where the substrate 54 moves to an opposite direction to a fitting direction, FIG. 11C is an explanatory drawing showing a case where the substrate 54 further moves to the opposite direction to the fitting direction, and FIG. 11D is a drawing showing a state being fit.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
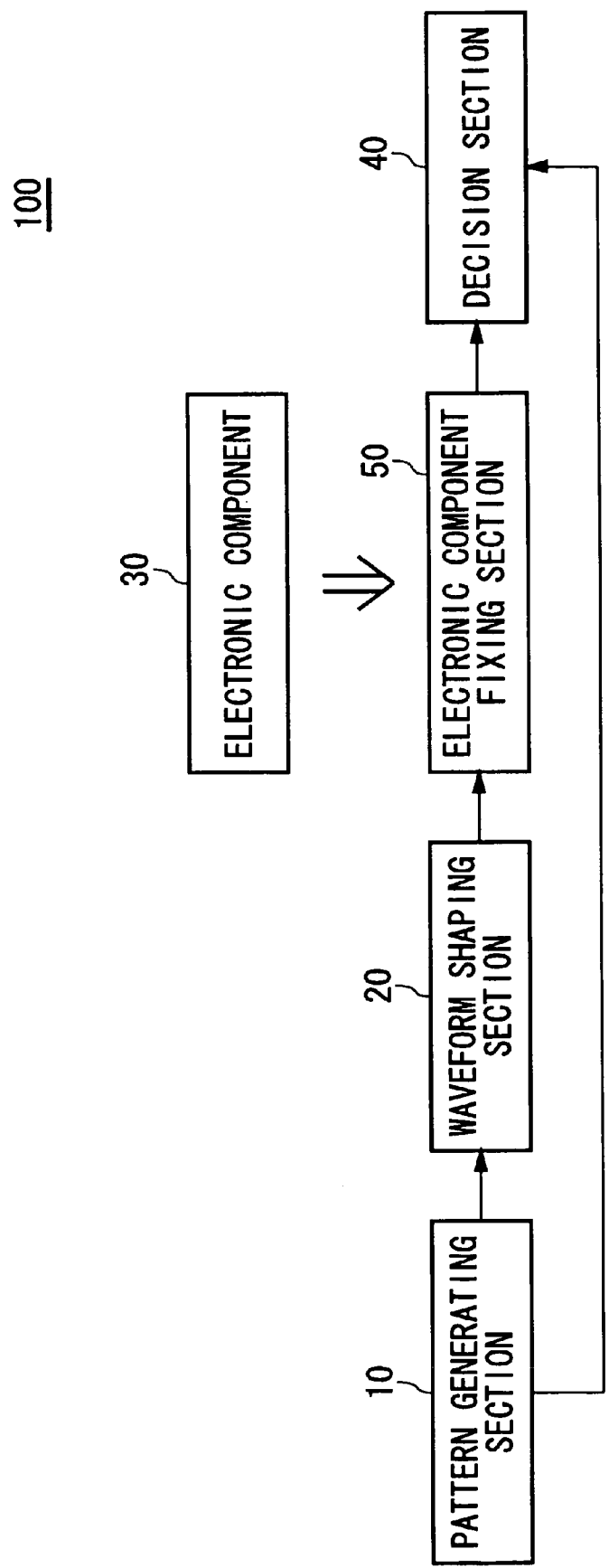
FIG. 1 is a block diagram exemplary showing a configuration of a tester 100 according to the present invention.

FIG. 1 is a block diagram exemplary showing a configuration of a tester 100 according to the present invention. The tester 100 tests an electronic component 30. The tester 100 includes a pattern generating section 10, a waveform shaping section 20, an electronic component fixing section 50, and a decision section 40.

The pattern generating section 10 generates a test signal for testing the electronic component 30. For example, a work station etc. may make the pattern generating section 10 generate the test signal based on the pattern to test the electronic component 30. The pattern generating section 10 supplies the test signal to the waveform shaping section 20.

The waveform shaping section 20 shapes the received test signal. The waveform shaping section 20 may supply the test signal to the electronic device 30 at desired timing. The waveform shaping section 20 supplies the shaped test signal to the electronic component fixing section 50.

The electronic component fixing section 50 supplies the test signal to the electronic component 30, and receives the output signal output from the electronic components 30 based on the test signal. The electronic component fixing section 50 supplies the received output signal to the decision section 40.

The decision section 40 decides acceptability of the electronic component 30 based on the received output signal. The decision section 40 may decide the acceptability of the electronic component 30 by comparing the received output signal and an expected value of the output signal which is to be output from the electronic component 30 based on the test signal. For example, the pattern generating section 10 may generate an expected value signal indicating the expected value of the output signal based on the test signal, and may supply it to the decision section 40. In this case, the decision section 40 compares the output signal with the expected value signal to decide the acceptability of the electronic component 30.

Moreover, the electronic component fixing section 50 includes a first substrate and a second substrate which opposing to the first substrate. A plurality of IC holders are provided on the surface of the first substrate to mount the electronic components 30 thereon, and the plurality of plugs electrically connected with the IC holders are provided on a rear surface of the first substrate. Moreover, a plurality of sockets, which fit to the plurality of plugs respectively, are provided on a surface of the second substrate opposing to the first substrate. The sockets electrically connect with the electronic components 30 via the plugs to send and receive signals. Moreover, the socket electrically connects with the waveform shaping section 20 and the decision section 40 to send and receive signals. The electronic component fixing section 50 is efficient because only the first substrate has to be changed even if it is the case where different types of electronic components 30 are to be tested.

Figure 2:
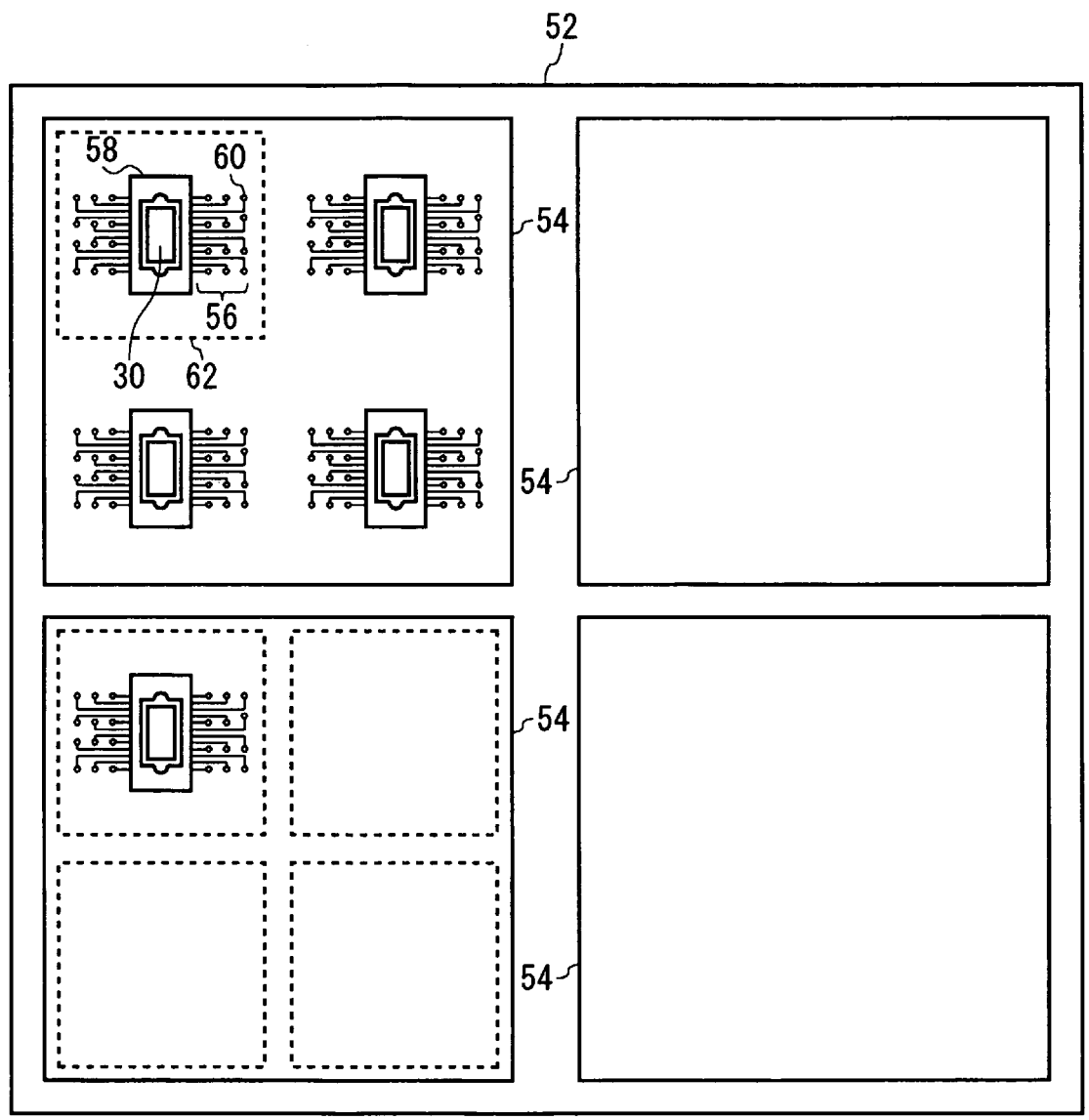
FIG. 2 is a surface view exemplary showing a first substrate 52 of an electronic component fixing section 50.

FIG. 2 is a surface view exemplary showing the first substrate 52 of the electronic component fixing section 50. The surface is a face on which the electronic components 30 to be tested are mounted. The electronic component fixing section 50 includes a first substrate 52, a plurality of socket boards 54 provided on the surface of the first substrate 52, a plurality of IC holders 58 provided on the surface of the socket boards 54, wirings 56, and a connector. The connector includes a plug and a socket which fits to the plug. The plug is provided on the first substrate 52, and the socket is provided on each of the second substrates, which will be explained later.

For example, the first substrate 52 may be a metal frame. The first substrate 52 may include groove part for mounting the socket boards 54. Moreover, the first substrate 52 includes apertures 62 at the locations where the IC holders 58 and the wirings 56 are to be provided. That is, on the rear face of the first substrate 52, a part of the rear face of the socket boards 54 on which the IC holders 58 and the wirings 56 are provided is exposed. Moreover, screws etc. may be used to fasten the socket boards 54 to the first substrate 52.

Each of the socket boards 54 is mounted on the first substrate 52. The socket board 54 includes a plurality of IC holders 58, a plurality of wirings 56, and a plurality of terminals 60 on the surface. The electronic components 30 to be tested are mounted on the IC holders 58. The wirings 56 connect the terminals 60 and the electronic component 30 electrically. The terminals 60 electrically connect with the plug, which will be described later with reference to FIG. 3.

The plug is provided on a rear face of the socket board 54. That is, the plug is provided on rear side of the first substrate 52.

Figure 3:
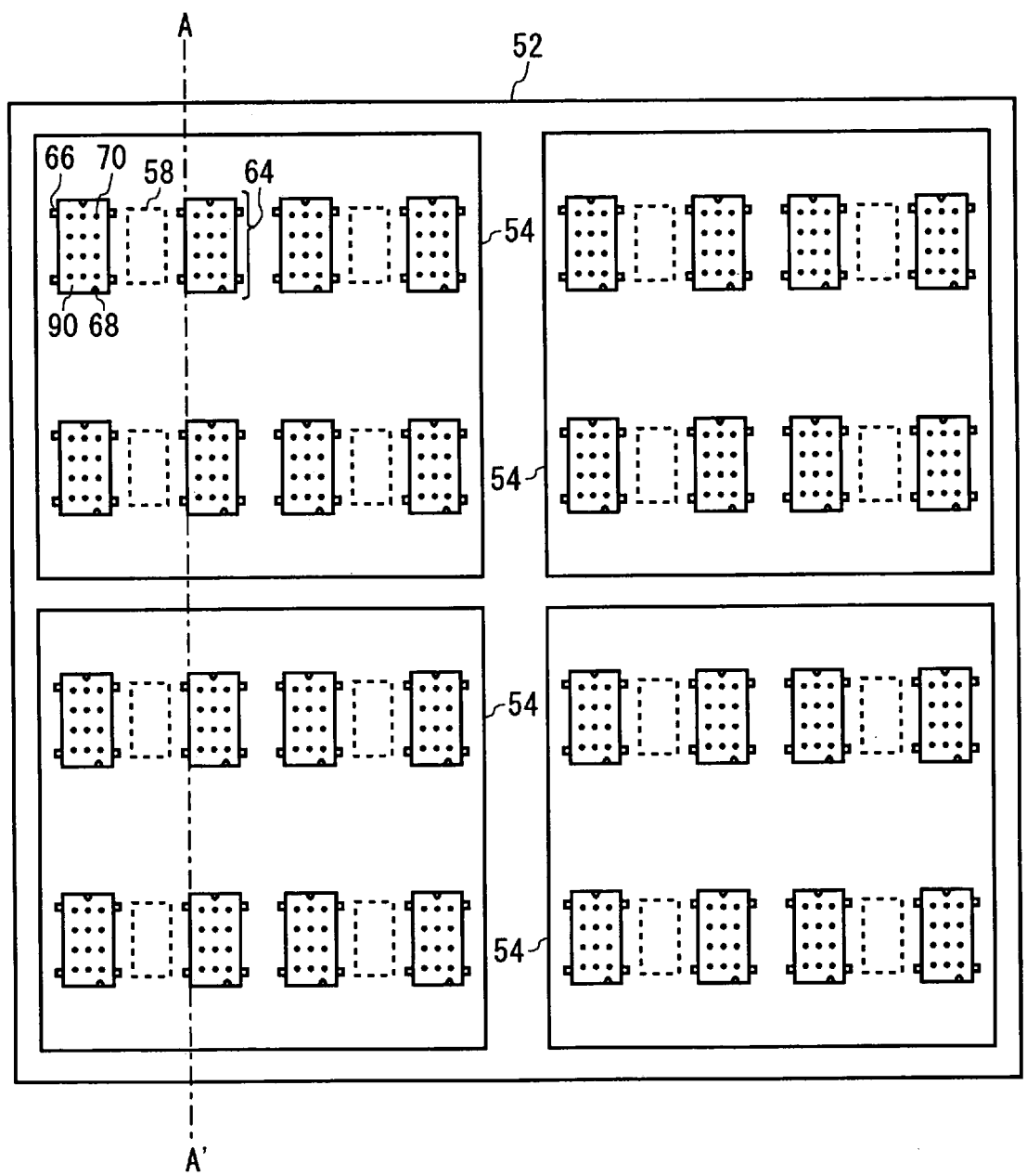
FIG. 3 is a rear view exemplary showing the first substrate 52 of the electronic component fixing section 50.

FIG. 3 is a back view exemplary showing a rear face of the first substrate 52 of the electronic component fixing section 50. The rear face is a rear side of the surface explained with reference to FIG. 2. The electronic component fixing section 50 further includes a plurality of plugs 64 provided on the rear face of the socket boards 54. The plugs 64 are provided at the corresponding position of the IC holders 58 provided on the surface of the first substrate 52. According to the present example shown in FIG. 3, the electronic component fixing section 50 includes two plugs 64 for one IC holder 58. Each plug 64 includes a plug holder 90, a plurality of protruding portions 66, a plurality of recesses 68, and a plurality of plug pins 70.

Each of the plug holders 90 is provided at the location substantially corresponding to the locations of the terminals 60 on the surface of the socket board 54. Moreover, the plug holder 90 has a plurality of plug pins 70 electrically connecting with the corresponding terminals 60. In this example, the plug pins 70 electrically connect with the terminals 60 provided on the surface of the socket board 54, and each plug pin 70 is electrically connects with an electronic component 30 via a corresponding terminal 60.

Moreover, the plurality of recesses 68 are provided on the rear face of the plug holders 90, which are substantially parallel with the rear face of the socket board. The recesses 68 engage with the guide protruding portions of the socket, which will be described later. Each of the recesses 68 is a recess having a predetermined depth in a direction substantially perpendicular to the rear face of the socket board 54. By engaging the recess 68 with the guide protruding portion, the fitting location of the plug 64 and the socket can be defined.

Moreover, a plurality of first protruding portions 66 are provided on a side face of the plug holder 90, which is substantially perpendicular to the rear face of the socket board 54. The first protruding portions 66 projects in the direction substantially parallel with the rear face of the socket board 54. Each of the first protruding portions 66 engages with a first groove part of a driving section, which will be described later. Each of the first protruding portions 66 is pressed down so that the plug 64 may fit to the socket (to be described later) when the driving section moves in a direction substantially parallel with the socket board 54. Moreover, as shown in FIG. 3, the plug 64 may include a plurality of first protruding portions 66 provided on a plurality of side faces of the plug holder 90.

Figure 4:
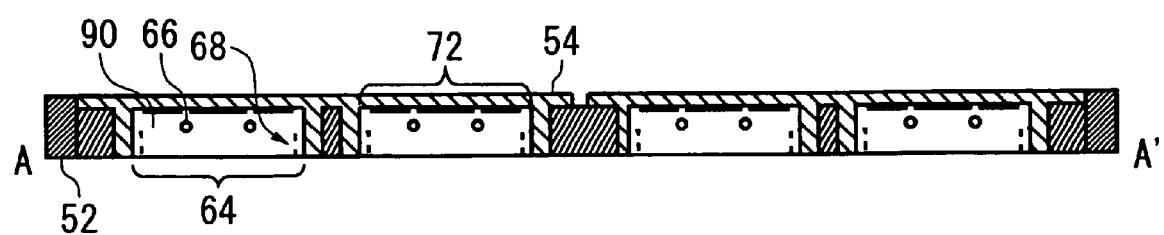
FIG. 4 is a side view exemplary showing plugs 64.

FIG. 4 is a side view exemplary showing the first substrate 52 and the socket board 54. FIG. 4 is a cross sectional view of the first substrate 52 and the socket boards 54 taken on line A–A' of FIG. 3. The plugs 64 are provided on the rear face of the socket board 54. As shown in FIG. 4, the socket board 54 may include groove parts 72 on which the plugs 64 are mounted on the rear face.

The plug holder 90 of the plug 64 may include a surface, of which the height is substantially the same as that of the rear face of the first substrate 52. Moreover, the plug holder 90 may include a surface, of which the height is substantially the same as that of the rear face of the socket board 54. That is, the depth of the groove part 72 of the socket board 54 may be substantially the same as length of the plug holder 90 in the depth direction of the groove part 72. Moreover, the depth of the groove part 72 of the socket board 54 may be longer than the length of the plug holder 90 in the depth direction of the groove part 72. That is, a part of the rear face of the socket board 54 may project from the rear face of the plug holder 90.

Moreover, the plug 64 includes a plurality of first protruding portions 66 and a plurality of recesses 68, as described above. The plurality of first protruding portions 66 are provided on the side face of the plug holder 90. In this example, the plug 64 includes two first protruding portions 66 on each of the two side faces of the plug holder 90, the two side faces opposing each other. Moreover, in this example, the plug 64 includes two recesses 68 on the rear face of the plug holder 90. The plug 64 may include the recesses 68 at ends of the rear face of the plug holder 90.

Figure 5:
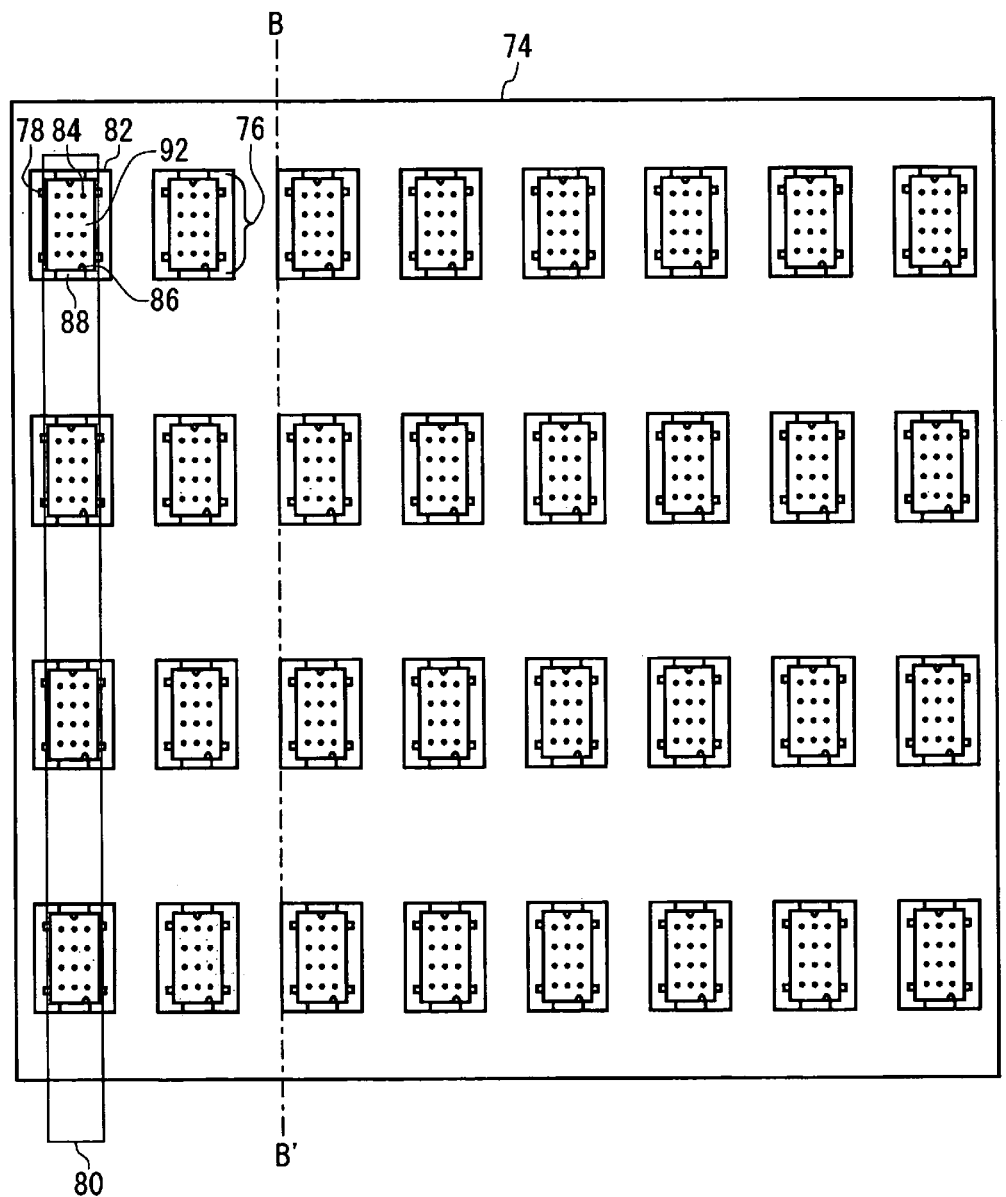
FIG. 5 is a surface view exemplary showing a second substrate 74 of the electronic component fixing section 50.

FIG. 5 is a surface view exemplary showing a second substrate 74 of the electronic component fixing section 50. As mentioned above, the electronic component fixing section 50 includes a plurality of sockets 76 provided on the surface of the second substrate 74. The plurality of sockets 76 are provided on the surface of the second substrate 74 opposing the rear face of the socket board 54 (refer to FIG. 3). The second substrate 74 includes a plurality of apertures 82, and the sockets 76 are mounted on the apertures 82, respectively. The sockets 76 are provided at locations corresponding to the plugs 64 provided on the rear face of the first substrate 52. Each of the sockets 76 includes a plurality of second protruding portions 78, a plurality of socket pins 84, a plurality of guide protruding portions 86, and a socket holder 92. Moreover, the electronic component fixing section 50 further includes a driving section 80. The driving section 80 includes a plurality of groove parts in which the groove parts engage with the first protruding portions 66 of the plug 64, and the second protruding portions 78 of the socket 76.

The socket pins 84 electrically connect the electronic component 30 with the waveform shaping section 20 and the decision section 40. When the socket 76 fits to the plug 64, the socket pins 84 electrically connect with the plug pins 70, thereby electrically connect with the electronic component 30 via the plug pins 70. The waveform shaping section 20 supplies a test signal to the electronic component 30 via the socket pins 84 and the plug pins 70. Moreover, the decision section 40 (refer to FIG. 1) receives an output signal from the electronic component 30 via the plug pins 70 and the socket pins 84.

The guide protruding portions 86 are provided on the surfaces of the socket holder 92, which is substantially parallel with the surface of the second substrate 74, and engage with the recesses 68 of the plug 64, which have been described above. Each of the guide protruding portions 86 is a protrusion having a predetermined height in a direction substantially perpendicular to the surface of the second substrate 74. By engaging the guide protruding portion 86 with the recess 68, the fitting location of the plug 64 and the socket 76 can be defined.

The second protruding portions 78 are provided on the side faces of the socket holder 92, which are substantially perpendicular to the surface of the second substrate 74, and projects in the direction substantially parallel with the surface of the second substrate 74. The second protruding portions 78 engage with second groove parts of the driving section 80, which will be described later. When the driving section 80 moves in the direction substantially parallel with the surface of the second substrate 74, the second protruding portions 78 are pressed down so that the socket 76 may fit to the plug 64.

The socket holder 92 has a plurality of socket pins 84. Moreover, the socket holder 92 includes a support section 88 for supporting the socket holder 92. By the support section 88 engaging with the groove part provided on the aperture 82, the socket holder 92 is mounted on the aperture 82. Moreover, as shown in FIG. 5, the socket 76 may include a plurality of second protruding portions 78 provided on a plurality of side faces of the socket holder 92.

Figure 6:
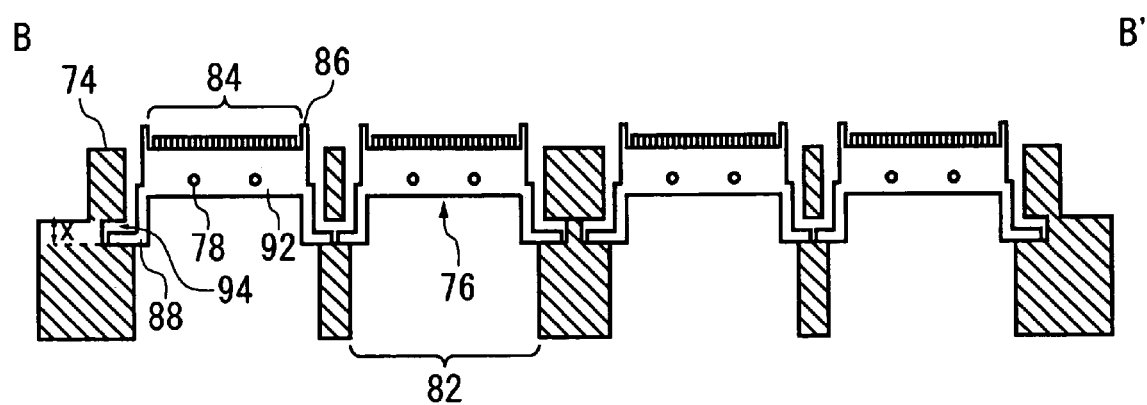
FIG. 6 is a side view exemplary showing sockets 76.

FIG. 6 is a side view exemplary showing the second substrate 74 and the sockets 76. FIG. 6 is a cross sectional view of the second substrate 74 and the sockets 76 taken on line B–B' of FIG. 5. The sockets 76 are provided on the surface of the second substrate 74. The second substrate 74 includes apertures 82 in which the sockets 76 are provided as shown in FIG. 6. Moreover, the second substrate 74 includes groove parts 94 on the side faces of the apertures 82 as shown in FIG. 6.

The socket holder 92 of the socket 76 includes support sections 88 engaging with the groove parts 94 of the second substrate 74. Each of the groove parts 94 has a predetermined height x in the fitting direction of the socket 76 and the plug 64. Therefore, the socket 76 can move along the fitting direction up to the height x of the groove part 94.

Moreover, the socket 76 includes a plurality of second protruding portions 78 and a plurality of guide protruding portions 86, as mentioned above. The plurality of second protruding portions 78 are provided in the side faces of the socket holder 92. In this example, the socket 76 includes two second protruding portions 78 in each of the two side faces of the socket holder 92 opposing each other. Moreover, in this example, the socket 76 includes two guide protruding portions 86 on the surface of the socket holder 92. The socket 76 may include a guide protruding portions 86 at the ends of the surface of the socket holder 92. The socket 76 includes the guide protruding portions 86 at the location corresponding to the recesses 68 of the plug 64.

Figure 7A:
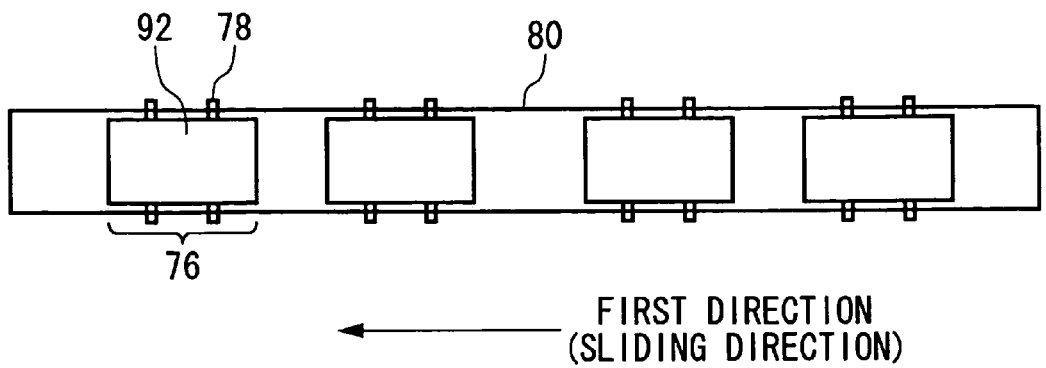
Figure 7B:
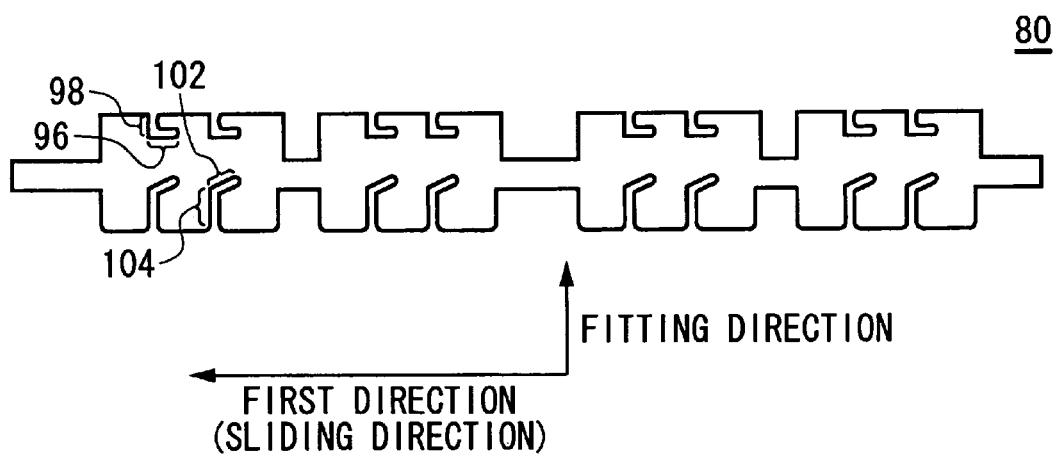
Figure 7C:
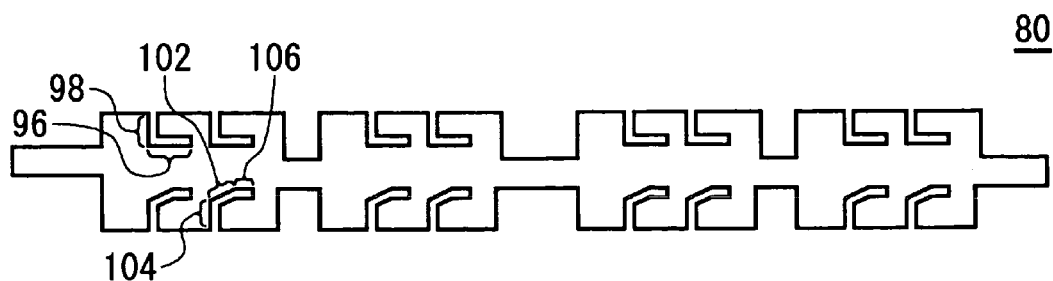

FIGS. 7A–7C are drawings exemplary showing the configuration of the driving section 80. FIG. 7A shows a relation of the driving section 80 and the sockets 76 seen from the fitting direction. As shown in FIG. 7A, the driving section 80 includes two side faces substantially parallel with the sides of the socket holders 92 on which the second protruding portions 78 are provided, and two side faces substantially perpendicular to the sides of the socket holder 92 on which the second protruding portion 78 is provided.

The driving section 80 makes the sockets 76 fit to the plugs 64 by moving in the direction substantially perpendicular to the fitting direction of the sockets 76 and the plugs 64 and in a sliding direction, i.e., a first direction substantially parallel with the side face of the socket holders 92 on which the second protruding portions 78 are provided. The driving section 80 includes a groove part for engaging the second protruding portion 78 of the socket 76 with the first protruding portion 66 of the plug 64. Groove parts are provided on the two side faces of the driving section 80, which are substantially parallel with the side face of the plug holder 90 on which the first protruding portions 66 are provided and with the side face of the socket holders 92 on which the second protruding portions 78 are provided. As shown in FIG. 7A, the groove parts may be groove parts which go through the side face of the driving section 80, and may be groove parts which do not go through the side face of the driving section 80.

FIG. 7B shows an example of the side face of the driving section 80. The driving section 80 includes first groove parts 96, second groove parts 102, third groove parts 98, and fourth groove parts 104. The first groove parts 96 are formed along the first direction. That is, each of the first groove parts 96 has a predetermined length in the first direction and has a predetermined width in the fitting direction. Here, the fitting direction is a moving direction of the sockets 76 to fit to the plugs 64. It is preferable that the moving length of the driving section 80 is shorter than the length of each of the first groove parts 96 in the first direction. Moreover, the width of each of the first groove parts 96 and the width of each of the third groove parts 98 may be longer than the width of each of the first protruding portions 66. The first protruding portions 66 of the plugs 64 engage with the first groove parts 96 and the third groove parts 98.

Each of the third groove parts 98 extends from an end of each of the first groove parts 96 to the fitting direction. In this example, each of the third groove parts 98 extends from a first end of each of the first groove parts 96 to an end of the side face of the driving section 80. It is preferable that the third groove parts 98 extend to substantially the same direction as the fitting direction. When the plug 64 fits to the socket 76, the first protruding portions 66 of the plug 64 engage with the third groove parts 98 from the end of the side face of the driving section 80, and they move toward the first ends of the first groove parts 96. Next, when the driving section 80 moves to the first direction, the first protruding portions 66 move to the other ends of the first groove parts 96.

Each of the second groove parts 102 is inclined to the first direction. Each of the second groove parts 102 is inclined at a predetermined angle to the first direction and to the fitting direction, respectively. The length of each of the second groove parts 102 is substantially the same as that of each of the first groove parts 96 in the first direction. Moreover, the first end of each of the first groove parts 96 and a first end of each of the second groove parts 102 may be provided at substantially the same location as each other in the first direction, and the other end of each of the first groove parts 96 and the other end of each of the second groove parts 102 may be provided at substantially the same location as each other in the first direction. Moreover, the first end of each of the second groove parts 102 and the other end of the second groove part 102 are provided at different locations from each other in the fitting direction.

Each of the fourth groove parts 104 extends from an end of each of the second groove parts 102 to an opposite direction to the fitting direction. In this example, each of the fourth groove parts 104 extends from the first end of each of the second groove parts 102 to the end of the side face of the driving section 80. When the plug 64 fits to the socket 76, the second protruding portions 78 of the socket 76 engage with the fourth groove parts 104 from the end of the side face of the driving section 80, and they move to the first ends of the second groove parts 102. Next, when the driving section 80 moves to the first direction, the second protruding portions 78 move to the other end of the second groove parts 102. Since the distance from the other end of each of the first groove parts 96 to the other end of each of the second groove parts 102 is shorter than the distance from the first end of each of the first groove parts 96 to the first end of each of the second groove parts 102, when the driving section 80 moves to the first direction, the distance between the plug 64 and the socket 76 decreases, and hence the plug 64 fits to the socket 76.

Moreover, the driving section 80 includes a plurality of first groove parts 96, a plurality of second groove parts 102, a plurality of third groove parts 98, and a plurality of fourth groove parts 104 corresponding to the plurality of plugs 64 and the plurality of sockets 76, as shown in FIG. 7B. By moving the driving section 80 to the first direction, the plurality of plugs 64 fits to the plurality of sockets 76 simultaneously. The driving section 80 includes a plurality of first groove parts 96 at substantially the same location as each other in the fitting direction. Moreover, the driving section 80 includes a plurality of second groove parts 102 at substantially the same location as each other in the fitting direction. The plug 64 includes a plurality of first protruding portions 66, each of which engaging with either of the plurality of first groove parts 96, at substantially the same location as each other in the fitting direction. Moreover, the socket 76 includes a plurality of second protruding portions 78, each of which engaging with either of the plurality of second groove parts 102, at substantially the same location as each other in the fitting direction.

FIG. 7C shows another example of the side face of the driving section 80. In addition to the configuration of the driving section 80 explained in FIG. 7B, the driving section 80 further includes fifth groove parts 106. Each of the fifth groove parts 106 extends from the other end of each of the second groove parts 102 to the opposite direction to the first direction. In this case, the length of each of the first groove parts 96 is substantially the same as the length of each of the second groove parts 102 plus the length of each of the fifth groove parts 106 in the first direction.

When the driving section 80 moves to the first direction, the second protruding portions 78 moves to ends of the fifth groove parts 106. By moving the second protruding portions 78 to the ends of the fifth groove parts 106 extending in a direction perpendicular to the fitting direction in the state where the plug 64 fitting to the socket 76, the fitting between the plug 64 and the socket 76 can be kept stable.

Figure 8:
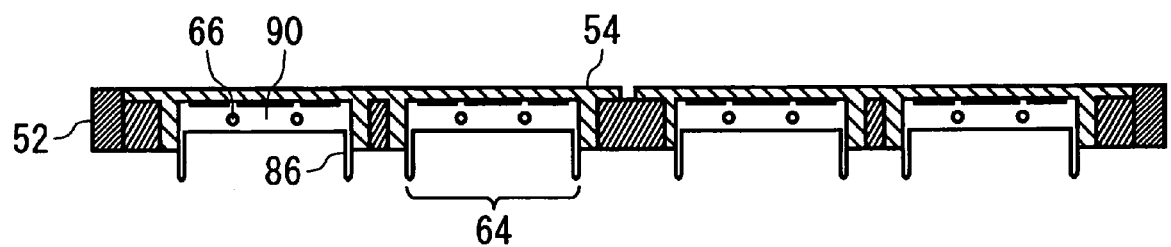
FIG. 8 is a drawing showing another example of the configuration of the plugs 64.

FIG. 8 shows another example of the configuration of the plugs 64. In FIG. 8, function and configuration of components bearing the same reference numerals as FIG. 4 are the same as or similar to those explained with reference to FIG. 4. Each of the plugs 64 includes guide protruding portions 86 instead of the recesses 68 of the plug 64 explained with reference to FIG. 4. Function and configuration of the guide protruding portions 86 are the same as or similar to those of the guide protruding portions 86 explained with reference to FIG. 6.

Figure 9:
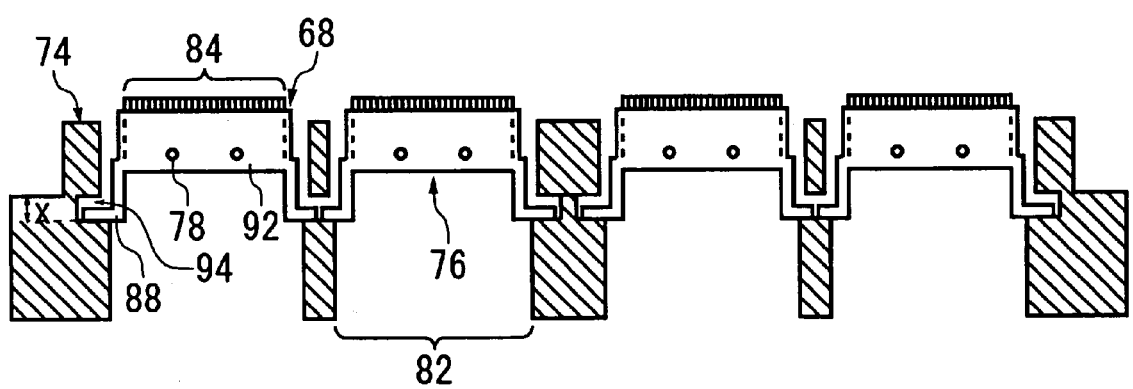
FIG. 9 is a drawing showing another example of the configuration of the sockets 76.

FIG. 9 shows another example of the configuration of the sockets 76. In FIG. 9, function and configuration of components bearing the same reference numerals as FIG. 6 are the same as or similar to those explained with reference to FIG. 6. Each of the sockets 76 includes recesses 68 instead of the guide protruding portions 86 of the socket 76 explained with reference to FIG. 6. Function and configuration of the recess 68 are the same as or similar to those of the recess 68 explained with reference to FIG. 4.

Figure 10:
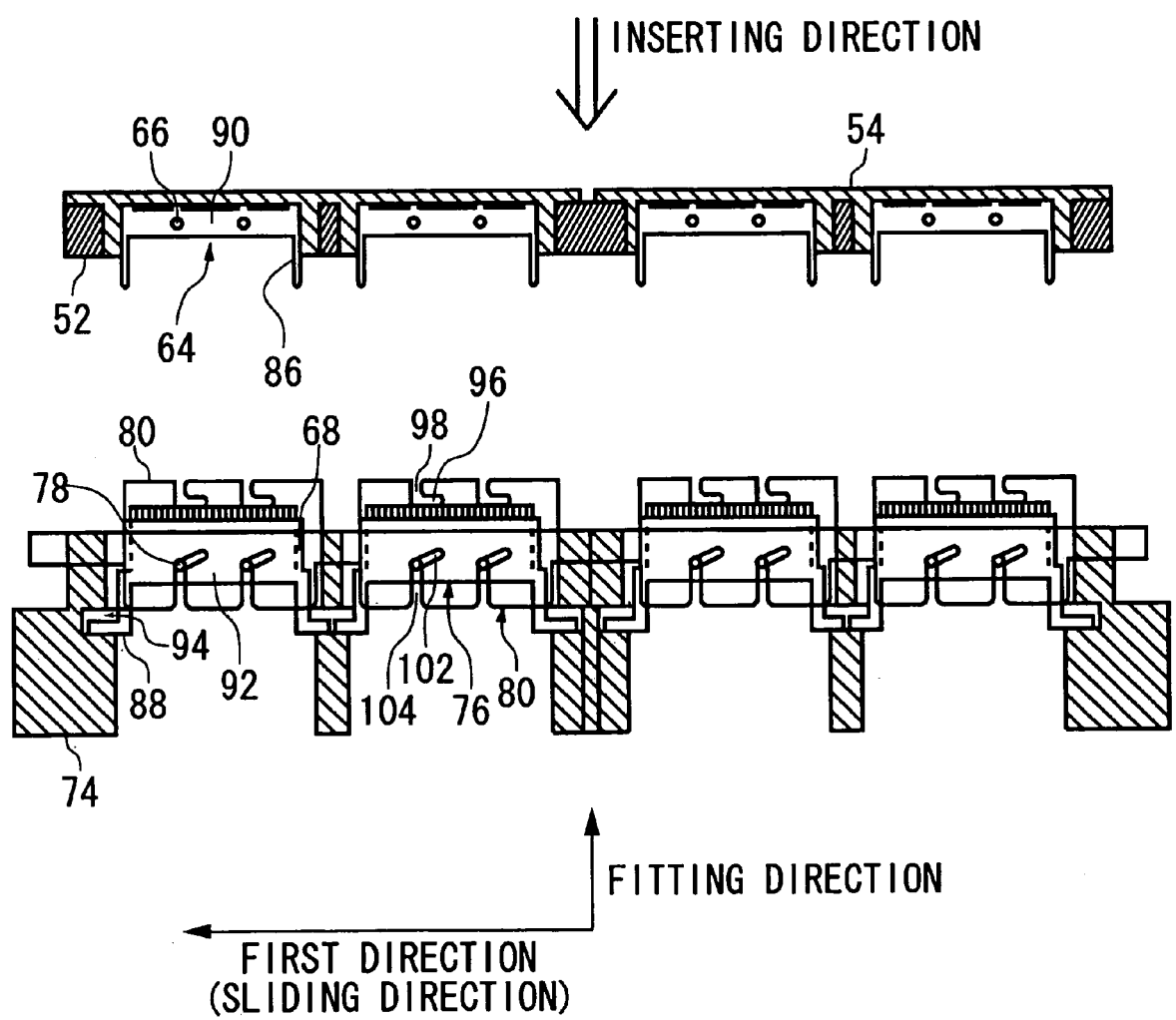
FIG. 10 is a drawing exemplary showing the plugs 64, the sockets 76, and the driving section 80 before fitting.

FIG. 10 is a drawing exemplary showing the plugs 64, the sockets 76, and the driving section 80 before fitting. In this example, configuration and function of the plugs 64 are the same as those of the plugs 64 explained with reference to FIG. 8, and configuration and function of the sockets 76 are the same as those of the sockets 76 explained with reference to FIG. 9. The driving section 80 is mounted on the second substrate 74, and the second protruding portions 78 of the sockets 76 engage with the first ends of the second groove parts of the driving section 80.

At the time of fitting, the first substrate 54 moves to the opposite direction to the fitting direction shown in FIG. 10, and the guide protruding portions 86 of the plugs 64 engage with the recesses 68 of the sockets 76. The first substrate 54 moves to the opposite direction to the fitting direction until the first protruding portions 66 of the plugs 64 engage with the first ends of the first groove parts 96 of the driving section 80. Next, the driving section 80 moves to the first direction to make the plugs 64 fit to the sockets 76. Hereafter, movement of the plugs 64 and the sockets 76 at the time of the fitting will be explained.

Figure 11A:
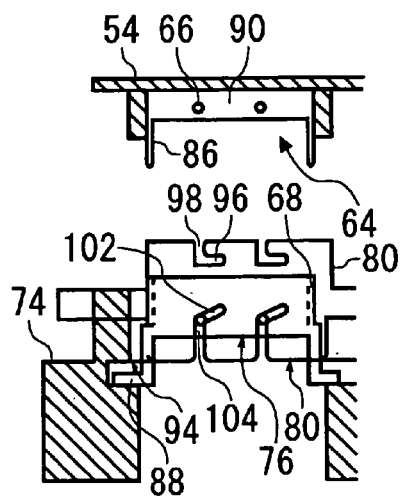
Figure 11B:
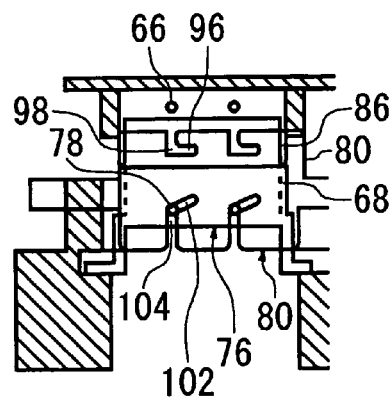

FIGS. 11A–D are explanatory drawings showing a movement of the plug 64 and the socket 76 during the fitting operation. FIG. 11A is explanatory drawing showing the plug 64, the socket 76, and the driving section 80 before the fitting. Next, as shown in FIG. 11B, the substrate 54 moves to the opposite direction to the fitting direction, and the guide protruding portions 86 of the plug 64 is made to approach the recesses 68 of the socket 76. At this time, the first protruding portions 66 of the plug 64 approach the third groove parts 98 of the driving section 80.

Figure 11C:
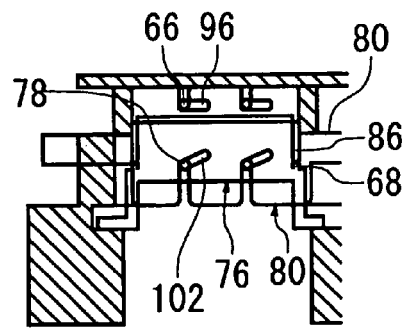

Next, as shown in FIG. 11C, the substrate 54 further moves to the opposite direction to the fitting direction, and the guide protruding portions 86 are inserted into the recesses 68. At this time, the first protruding portions 66 of the plug 64 engage with the first ends of the first groove parts 96 of the driving section 80. That is, the substrate 54 moves to the opposite direction to the fitting direction until the first protruding portions 66 engage with the first ends of the first groove parts 96.

Figure 11D:
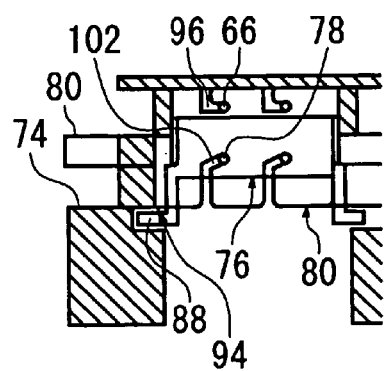

Next, as shown in FIG. 11D, the driving section 80 moves to the first direction so that the plug 64 fits to the socket 76. When the driving section 80 moves to the first direction, the first protruding portions 66 engage with the other ends of the first groove parts 96, and the second protruding portions 78 engage with the other ends of the second groove parts 102. Therefore, in the second groove parts 102, while the driving section 80 presses down the second protruding portions 78 toward the fitting direction, the driving section 80 presses down the first protruding portions 66 toward the opposite direction to the fitting direction in the first groove parts 96. That is, the driving section 80 presses down the plug 64 and the socket 76 in the direction so that the plug 64 fits to the socket 76 in the first groove parts 96 and the second groove parts 102.

The socket 76 is movable along the fitting direction in the domain of the groove parts 94 of the second substrate 74. Therefore, by pressing down the second protruding portions 78, the socket 76 moves to the fitting direction to fit to the plug 64. Moreover, by pressing the first protruding portions 66, the plug 64 may move to the opposite direction to the fitting direction to fit to the socket 76.

According to the electronic component fixing section 50 in this example, the plugs 64 of the plurality of the connectors may fit to their plurality of sockets 76 accurately and easily. Moreover, in this example, although the driving section 80 includes a plurality of groove parts (96 98, 102, 104) and the plug 64 and the socket 76 include a plurality of protruding portions (66 78), in another example, the driving section 80 may include a plurality of protruding portions (66 78), and the plug and the socket 76 may include a plurality of groove parts (96 98, 102, 104).

As is apparent from the above description, according to the connector of the present invention, the plug may fit to the socket accurately. Moreover, according to the electronic component fixing section of the present invention, the fitting of the plurality of connectors can be carried out accurately and efficiently. Moreover, according to the tester of the present invention, a plurality of electronic components can be tested accurately and efficiently.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A connector, comprising:
   a plurality of plugs provided on a first substrate, each of said plugs including a first protruding portion;
   a plurality of sockets provided on a second substrate, each of said sockets including a second protruding portion;
   a driving section operable to fit said plurality of plugs to said plurality of sockets by moving to a first direction substantially perpendicular to a fitting direction in which said plugs fit to said sockets, said driving section comprising a plurality of first groove parts extending in the first direction and a plurality of second groove parts, each of said first groove parts being engageable with said first protruding portion and each of said second groove parts being engageable with said second protruding portion;
   wherein each of said second groove parts of said driving section includes a portion which allows moving of said sockets in the fitting direction in relation to the movement of said driving section, the second substrate includes a plurality of first members which allow the moving of said sockets in the fitting direction in relation to the second substrate, and each of said sockets includes a second member engageable with each of said first members on said second substrate; and
   wherein when connecting said plugs and said sockets, a distance by which said second groove part allows said socket to move in the fitting direction is shorter than a distance by which said first member of said second substrate and said second member of said socket allow said socket to move in the fitting direction.

2. The connector as claimed in claim 1, wherein said driving section further comprises a fourth groove part extending from an end of said second groove part to the fitting direction.

3. The connector as claimed in claim 1, wherein said driving section presses said first protruding portion to a direction opposite to the fitting direction in said first groove part and presses said second protruding portion to the fitting direction in said second groove part when said driving section moves to the first direction.

4. The connector as claimed in claim 1, wherein said driving section further comprises a third groove part extending from an end of said first groove part to the fitting direction.

5. The connector as claimed in claim 4, wherein said plug comprises:
   a plurality of plug pins electrically connecting with an electronic component, and
   a plug holder having said plurality of plug pins, wherein said first protruding portion is provided in said plug holder.

6. The connector as claimed in claim 1, wherein said socket comprises:
   a plurality of socket pins electrically connecting with an electronic component, and
   a socket holder having said plurality of socket pins, wherein said second protruding portion is provided in said socket holder.

7. The connector as claimed in claim 1, wherein
   said plug comprises a recess on a surface which is to fit to said socket, and
   said socket comprises a guide protruding portion engaging with said recess on a surface which is to fit to said plug.

8. The connector as claimed in claim 7, wherein
   said plug comprises a plurality of said recesses, and
   said socket comprises a plurality of said guide protruding portions, each of which engaging with either of said plurality of recesses.

9. The connector as claimed in claim 1, wherein the portion which allows the moving of said socket is inclined in the first direction.

10. The connector as claimed in claim 1, wherein the plurality of first members on said second substrate include a plurality of groove parts having a predetermined height in the fitting direction and the second member of said socket includes a supporting section which engages with one of said groove parts, and wherein a length of a space formed between said groove part and said supporting section is larger than a moving length by which said part of said second groove allows the relative movement of said socket in the fitting direction.

11. The connector as claimed in claim 1, wherein said first substrate comprises a plurality of socket boards on a surface thereof, and each of said socket boards comprise a plurality of IC holders.

12. An electronic component fixing device operable to fix an electronic component, comprising:
    a first substrate;
    a plurality of IC holders provided on said first substrate mounting thereon the electronic component;
    a plurality of plugs provided on said first substrate electrically connecting with the electronic component, each of said plugs including a first protruding portion; second substrate;
    a plurality of sockets provided on said second substrate, each of said plurality of sockets including a second protruding portion; and
    a driving section operable to fit said plurality of plugs to said plurality of sockets by moving to a first direction substantially perpendicular to a fitting direction in which said plugs fit to said sockets, said driving section comprising a plurality of first groove parts extending in the first direction and a plurality of second groove parts, each of said first groove parts being engageable with said first protruding portion and each of said second groove parts being engageable with said second protruding portion;
    wherein each of said second groove parts of said driving section includes a portion which allows moving of said sockets in the fitting direction in relation to the movement of said driving section, the second substrate includes a plurality of first members which allow the moving of said sockets in the fitting direction in relation to the second substrate, and each of said sockets includes a second member engageable with each of said first members on said second substrate; and
    wherein when connecting said plugs and said sockets, a distance by which said second groove part allows said socket to move in the fitting direction is shorter than a distance by which said first member of said second substrate and said second member of said socket allow said socket to move in the fitting direction.

13. The electronic component fixing device as claimed in claim 12, wherein the plurality of first members on said second substrate include a plurality of groove parts having a predetermined height in the fitting direction and the second member of said socket includes a supporting section which engages with one of said groove parts, and wherein a length of a space formed between said groove part and said supporting section is larger than a moving length by which said part of said second groove allows the relative movement of said socket in the fitting direction, the portion which allows the moving of said socket is inclined in the first direction.

14. The electronic component fixing device as claimed in claim 12, wherein the portion which allows the moving of said socket is inclined in the first direction.

15. The electronic component fixing device as claimed in claim 12, wherein said first substrate comprises a plurality of socket boards on a surface thereof, and each of said socket boards comprise a plurality of IC holders.

16. A tester operable to test an electronic component, comprising:
   a pattern generating section operable to generate a test signal for testing the electronic component;
   a waveform shaping section operable to shape the test signal;
   an electronic component fixing section operable to supply the test signal to the electronic component and to receive an output signal output from the electronic component based on the test signal; and
   a decision section operable to decide acceptability of the electronic component based on the output signal, wherein
   said electronic component fixing section comprises:
      a first substrate;
      a plurality of IC holders provided on said first substrate mounting thereon the electronic component;
      a plurality of plugs provided on said first substrate electrically connecting with the electronic component, each of said plugs including a first protruding portion;
      second substrate;
      a plurality of sockets provided on said second substrate, each of said plurality of sockets including a second protruding portion; and
      a driving section operable to fit said plurality of plugs to said plurality of sockets by said sockets moving to a first direction substantially perpendicular to a fitting direction in which said plugs fit to said sockets, said driving section comprising a plurality of first groove parts extending in the first direction and a plurality of second groove parts, each of said first groove parts being engageable with said first protruding portion and each of said second groove parts being engageable with said second protruding portion;
   wherein each of said second groove parts of said driving section includes a portion which allows moving of said sockets in the fitting direction in relation to the movement of said driving section, the second substrate includes a plurality of first members which allow the moving of said sockets in the fitting direction in relation to the second substrate, and each of said sockets includes a second member engageable with each of said first members on said second substrate; and
   wherein when connecting said plugs and said sockets, a distance by which said second groove part allows said socket to move in the fitting direction is shorter than a distance by which said first member of said second substrate and said second member of said socket allow said socket to move in the fitting direction.

\* \* \* \* \*